United States Patent
Bhakta et al.

(10) Patent No.: US 7,286,436 B2
(45) Date of Patent: Oct. 23, 2007

(54) HIGH-DENSITY MEMORY MODULE UTILIZING LOW-DENSITY MEMORY COMPONENTS

(75) Inventors: Jayesh R. Bhakta, Cerritos, CA (US); Jeffrey Solomon, Irvine, CA (US); William M. Gervasi, Ladera Ranch, CA (US)

(73) Assignee: Netlist, Inc., Irvine, CA (US)

( * ) Notice: Subject to any disclaimer, the term of this patent is extended or adjusted under 35 U.S.C. 154(b) by 69 days.

(21) Appl. No.: 11/075,395

(22) Filed: Mar. 7, 2005

(65) Prior Publication Data

US 2005/0281096 A1  Dec. 22, 2005

Related U.S. Application Data

(60) Provisional application No. 60/590,038, filed on Jul. 21, 2004, provisional application No. 60/575,595, filed on May 28, 2004, provisional application No. 60/550,668, filed on Mar. 5, 2004.

(51) Int. Cl.
*G11C 8/00* (2006.01)

(52) U.S. Cl. .......................... 365/230.02; 365/230.06; 711/211

(58) Field of Classification Search ............ 365/230.01, 365/230.02 X, 230.06 X; 711/5, 6, 211 X
See application file for complete search history.

(56) References Cited

U.S. PATENT DOCUMENTS

| | | | |
|---|---|---|---|
| 5,247,643 A | 9/1993 | Shottan | |
| 5,703,826 A | 12/1997 | Hush et al. | |
| 5,805,520 A * | 9/1998 | Anglada et al. | 365/230.02 |
| 6,154,418 A | 11/2000 | Li | |
| 6,453,381 B1 | 9/2002 | Yuan et al. | |
| 6,518,794 B2 | 2/2003 | Coteus et al. | |
| 6,681,301 B1 | 1/2004 | Mehta et al. | |
| 6,785,189 B2 | 8/2004 | Jacobs et al. | |
| 6,807,125 B2 | 10/2004 | Coteus et al. | |
| 6,813,196 B2 | 11/2004 | Park et al. | |
| 6,944,694 B2 * | 9/2005 | Pax | 710/107 |
| 6,996,686 B2 * | 2/2006 | Doblar et al. | 711/157 |
| 2001/0052057 A1 | 12/2001 | Lai et al. | |
| 2002/0088633 A1 | 7/2002 | Kong et al. | |
| 2003/0063514 A1 | 4/2003 | Faue | |
| 2003/0191995 A1 | 10/2003 | Abrosimov et al. | |
| 2003/0210575 A1 | 11/2003 | Seo et al. | |
| 2004/0037158 A1 | 2/2004 | Coteus et al. | |
| 2005/0036378 A1 | 2/2005 | Kawaguchi et al. | |

OTHER PUBLICATIONS

Cuppu, Vinodh, et al., "A Performance Comparison of Contemporary DRAM Architectures," *IEEE Proceedings of the 26th International Symposium on Computer Architecture*, May 2-4, 1999, Atlanta, Georgia, pp. 1-12.

(Continued)

*Primary Examiner*—VanThu Nguyen
(74) *Attorney, Agent, or Firm*—Knobbe Martens Olson & Bear LLP

(57) ABSTRACT

A memory module comprises a plurality of memory components. Each memory component has a first bit width. The plurality of memory components are configured as one or more pairs of memory components. Each pair of memory components simulates a single virtual memory component having a second bit width which is twice the first bit width.

20 Claims, 11 Drawing Sheets

OTHER PUBLICATIONS

JEDEC Standard No. 21-C, 4.20-2—168 Pin, PC133 SDRAM Registered Design Specification, Revision 1.4, Release 11a, Feb. 2002.

JEDEC Standard No. 21-C, 4.20-3—144 Pin, PC133 SDRAM Unbuffered SO-DIMM, Reference Design Specification, Revision 1.02, Release 11.

JEDEC Standard No. 21-C, DDR SDRAM PC2100 and PC1600 DDR SDRAM Registered DIMM Design Specification, Research 1.3, Release 11b, Jan. 2002.

JEDEC Standard No. 21-C, 4.20.5—184 Pin, PC1600/2100 DDR SDRAM Unbuffered DIMM Design Specification, Revision 1.1, Release 11b.

JEDEC Standard No. 21-C, 4.20.6—200 Pin, PC2700/PC2100/PC1600 DDR SDRAM Unbuffered SO-DIMM Reference Design Specification, Revision 1.1, Release 11b, Apr. 26, 2002.

JEDEC standard JESD79D, "Double Data Rate (DDR) SDRAM Specification," published Feb. 2004.

Intel Corporation, PC SDRAM Registered DIMM Design Support Document, Revision 1.2, Oct. 1998.

Intel Corporation, 66/100 MHz PC SDRAM 64-Bit Non-ECC/Parity 144 Pin Unbuffered SO-DIMM Specification, Revision 1.0, Feb. 1999.

* cited by examiner

HIGH-DENSITY MEMORY MODULE UTILIZING LOW-DENSITY MEMORY COMPONENTS

CLAIM OF PRIORITY

This application claims the benefit of U.S. Provisional Application No. 60/550,668, filed Mar. 5, 2004, U.S. Provisional Application No. 60/575,595, filed May 28, 2004, and U.S. Provisional Application No. 60/590,038, filed Jul. 21, 2004, each of which is incorporated in its entirety by reference herein.

BACKGROUND OF THE INVENTION

1. Field of the Invention

The present invention relates generally to memory modules comprising a plurality of memory components or integrated circuits, and more particularly, to configurations of the memory components of the memory module.

2. Description of the Related Art

Memory modules typically comprise a plurality of memory components, such as dynamic random-access memory (DRAM) integrated circuits or devices, mounted on a printed circuit board (PCB). Memory modules typically have a memory configuration with a unique combination of rows, columns, and banks which result in a total memory capacity for the memory module.

For example, a 512-Megabyte memory module (termed a "512-MB" memory module, which actually has $2^{29}$ or 536,870,912 bytes of capacity) will typically utilize eight 512-Megabit DRAM devices (each identified as a "512-Mb" DRAM device, each actually having $2^{29}$ or 536,870,912 bits of capacity). The memory cells (or memory locations) of each 512-Mb DRAM device can be arranged in four banks, with each bank having an array of $2^{24}$ (or 16,777,216) memory locations arranged as $2^{13}$ rows and $2^{11}$ columns, and with each memory location having a width of 8 bits. Such DRAM devices with 64M 8-bit-wide memory locations (actually with four banks of $2^{27}$ or 134,217,728 one-bit memory cells arranged to provide a total of $2^{26}$ or 67,108,864 memory locations with 8 bits each) are identified as having a "64 Mb×8" or "64M×8-bit" configuration, or as having a depth of 64M and a bit width of 8. Furthermore, certain commercially-available 512-MB memory modules are termed to have a "64M×8-byte" configuration or a "64M×64-bit" configuration with a depth of 64M and a width of 8 bytes or 64 bits.

Similarly, a 1-Gigabyte memory module (termed a "1-GB" memory module, which actually has $2^{30}$ or 1,073,741,824 bytes of capacity) can utilize eight 1-Gigabit DRAM devices (each identified as a "1-Gb" DRAM device, each actually having $2^{30}$ or 1,073,741,824 bits of capacity). The memory locations of each 1-Gb DRAM device can be arranged in four banks, with each bank having an array of memory locations with $2^{14}$ rows and $2^{11}$ columns, and with each memory location having a width of 8 bits. Such DRAM devices with 128M 8-bit-wide memory locations (actually with a total of $2^{27}$ or 134,217,728 memory locations with 8 bits each) are identified as having a "128 Mb×8" or "128M× 8-bit" configuration, or as having a depth of 128M and a bit width of 8. Furthermore, certain commercially-available 1-GB memory modules are identified as having a "128M 8-byte" configuration or a "128M 64-bit" configuration with a depth of 128M and a width of 8 bytes or 64 bits.

The commercially-available 512-MB (64M×8-byte) memory modules and the 1-GB (128M 8-byte) memory modules described above are typically used in computer systems (e.g., personal computers) which perform graphics applications since such "×8" configurations are compatible with data mask capabilities often used in such graphics applications. Conversely, memory modules with "×4" configurations are typically used in computer systems such as servers which are not as graphics-intensive. Examples of such commercially available "×4" memory modules include, but are not limited to, 512-MB (128M 4-byte) memory modules comprising eight 512-Mb (128 Mb×4) memory components.

SUMMARY OF THE INVENTION

In certain embodiments, a memory module comprises a plurality of memory components. Each memory component has a first bit width. The plurality of memory components are configured as one or more pairs of memory components. Each pair of memory components simulates a single virtual memory component having a second bit width which is twice the first bit width.

In certain embodiments, a memory module comprises a first memory component having a first data strobe pin. The memory module further comprises a second memory component having a second data strobe pin. The memory module further comprises a first resistor electrically coupled to the first data strobe pin. The memory module further comprises a second resistor electrically coupled to the second data strobe pin and to the first resistor. The first data strobe pin is electrically coupled to the second data strobe pin through the first resistor and through the second resistor.

In certain embodiments, a memory module comprises a termination bus. The memory module further comprises a first memory component having a first data strobe pin, a first termination signal pin electrically coupled to the termination bus, a first termination circuit, and at least one data pin. The first termination circuit selectively electrically terminates the first data strobe pin and the first data pin in response to a first signal received by the first termination signal pin from the termination bus. The memory module further comprises a second memory component having a second data strobe pin electrically coupled to the first data strobe pin, a second termination signal pin, a second termination circuit, and at least one data pin. The second termination signal pin is electrically coupled to a voltage. The second termination circuit is responsive to the voltage by not terminating the second data strobe pin or the second data pin. The memory module further comprises at least one termination assembly having a third termination signal pin, a third termination circuit, and at least one termination pin electrically coupled to the data pin of the second memory component. The third termination signal pin is electrically coupled to the termination bus. The third termination circuit selectively electrically terminates the data pin of the second memory component through the termination pin in response to a second signal received by the third termination signal pin from the termination bus.

In certain embodiments, a memory module comprises a pair of substantially identical memory components. Each memory component has a first bit width, a first number of banks of memory locations, a first number of row address bits, and a first number of column address bits. The memory module further comprises a serial-presence-detect (SPD) device comprising data that characterizes the pair of memory components as a virtual memory component having a second bit width equal to twice the first bit width, a second number of banks of memory locations equal to the first number of banks, a second number of row address bits equal to the first number of row address bits, and a second number of column address bits equal to the first number of column address bits.

In certain embodiments, a memory module has a first memory capacity. The memory module comprises a plurality of substantially identical memory components configured as a first rank and a second rank. The memory components of the first rank are configured in pairs with their respective data strobe pins tied together. The memory components of the second rank are configured in pairs with their respective data strobe pins tied together. The memory module further comprises a logic element which receives a first set of address and control signals compatible with a second memory capacity. The second memory density is substantially equal to one-half of the first memory capacity. The logic element translates the first set of address and control signals into a second set of address and control signals compatible with the first memory capacity of the memory module. The logic element transmits the second set of address and control signals to the first rank and the second rank.

In certain embodiments, a memory module has a first plurality of memory locations with a first memory density. The memory module comprises a plurality of substantially identical memory components configured as a first rank, a second rank, a third rank, and a fourth rank. The memory module further comprises a logic element which receives a first set of address and control signals compatible with a second plurality of memory locations having a second memory density. The second memory density is substantially equal to one-half of the first memory density. The logic element translates the first set of address and control signals into a second set of address and control signals compatible with the first plurality of memory locations of the memory module. The logic element transmits the second set of address and control signals to the first rank, the second rank, the third rank, and the fourth rank.

DETAILED DESCRIPTION OF EXEMPLARY EMBODIMENTS

Figure 1:
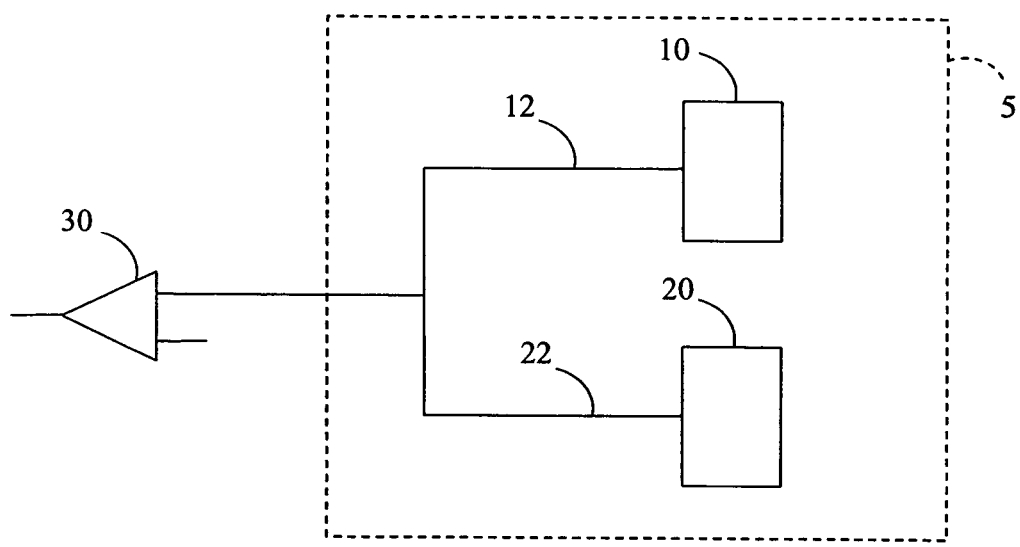
FIG. 1 schematically illustrates an exemplary memory module in which a data strobe (DQS) pin of a first memory component is electrically connected to a DQS pin of a second memory component while both DQS pins are active.

Most high-density memory modules are currently built with 512-Megabit ("512-Mb") memory components wherein each memory component has a 64M 8-bit configuration. For example, a 1-Gigabyte ("1-GB") memory module with error checking capabilities can be fabricated using eighteen such 512-Mb memory components. Alternatively, it can be economically advantageous to fabricate a 1-GB memory module using lower-density memory components and doubling the number of memory components used to produce the desired word width. For example, by fabricating a 1-GB memory module using thirty-six 256-Mb memory components with 64M 4-bit configuration, the cost of the resulting 1-GB memory module can be reduced since the unit cost of each 256-Mb memory component is typically lower than one-half the unit cost of each 512-Mb memory component. The cost savings can be significant, even though twice as many 256-Mb memory components are used in place of the 512-Mb memory components.

Market pricing factors for DRAM devices are such that higher-density DRAM devices (e.g., 1-Gb DRAM devices) are much more than twice the price of lower-density DRAM devices (e.g., 512-Mb DRAM devices). In other words, the price per bit ratio of the higher-density DRAM devices is greater than that of the lower-density DRAM devices. This pricing difference often lasts for months or even years after the introduction of the higher-density DRAM devices, until volume production factors reduce the costs of the newer higher-density DRAM devices. Thus, when the cost of a higher-density DRAM device is more than the cost of two lower-density DRAM devices, there is an economic incentive for utilizing pairs of the lower-density DRAM devices to replace individual higher-density DRAM devices.

For proper operation, the computer system advantageously recognizes the 1-GB memory module comprising the 256-Mb memory components with 64M 4-bit configuration as a 1-GB memory module having 512-Mb memory components with 64M 8-bit configuration (e.g., as a 1-GB memory module with 128M 8-byte configuration). This advantageous result would desirably be achieved by electrically connecting together two output signal pins (e.g., DQS or data strobe pins) of the two 256-Mb memory components such that both output signal pins are concurrently active when the two memory components are concurrently enabled. The DQS or data strobe is a bi-directional signal that is used during both read cycles and write cycles to validate or latch data. As used herein, the terms "tying together" or "tied together" refer to a configuration in which corresponding pins (e.g., DQS pins) of two memory components are electrically connected together and are concurrently active when the two memory components are concurrently enabled (e.g., by a common chip-select or CS signal). Such a configuration is different from standard memory module configurations in which the output signal pins (e.g., DQS pins) of two memory components are electrically coupled to the same source, but these pins are not concurrently active since the memory components are not concurrently enabled. However, a general guideline of memory module design warns against tying together two output signal pins in this way.

Figure 2:
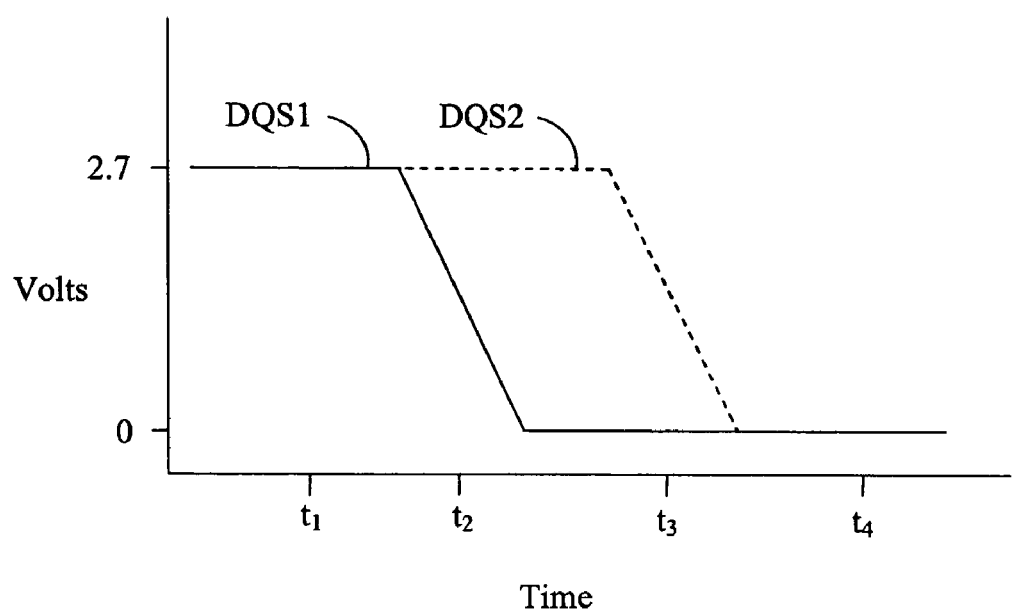
FIG. 2 is an exemplary timing diagram of the voltages applied to the two DQS pins due to non-simultaneous switching.

FIGS. 1 and 2 schematically illustrate a problem which may arise from tying together two output signal pins. FIG. 1 schematically illustrates an exemplary memory module 5 in which a first DQS pin 12 of a first memory component 10 is electrically connected to a second DQS pin 22 of a second memory component 20. The two DQS pins 12, 22 are both electrically connected to a memory controller 30.

FIG. 2 is an exemplary timing diagram of the voltages applied to the two DQS pins 12, 22 due to non-simultaneous switching. As illustrated by FIG. 2, at time $t_1$, both the first DQS pin 12 and the second DQS pin 22 are high, so no current flows between them. Similarly, at time $t_4$, both the first DQS pin 12 and the second DQS pin 22 are low, so no current flows between them. However, for times between approximately $t_2$ and approximately $t_3$, the first DQS pin 12 is low while the second DQS pin 22 is high. Under such conditions, a current will flow between the two DQS pins 12, 22. This condition in which one DQS pin is low while the other DQS pin is high can occur for fractions of a second (e.g., 0.8 nanoseconds) during the dynamic random-access memory (DRAM) read cycle. During such conditions, the current flowing between the two DQS pins 12, 22 can be substantial, resulting in heating of the memory components 10, 20, and contributing to the degradation of reliability and eventual failure of these memory components.

Figure 3:
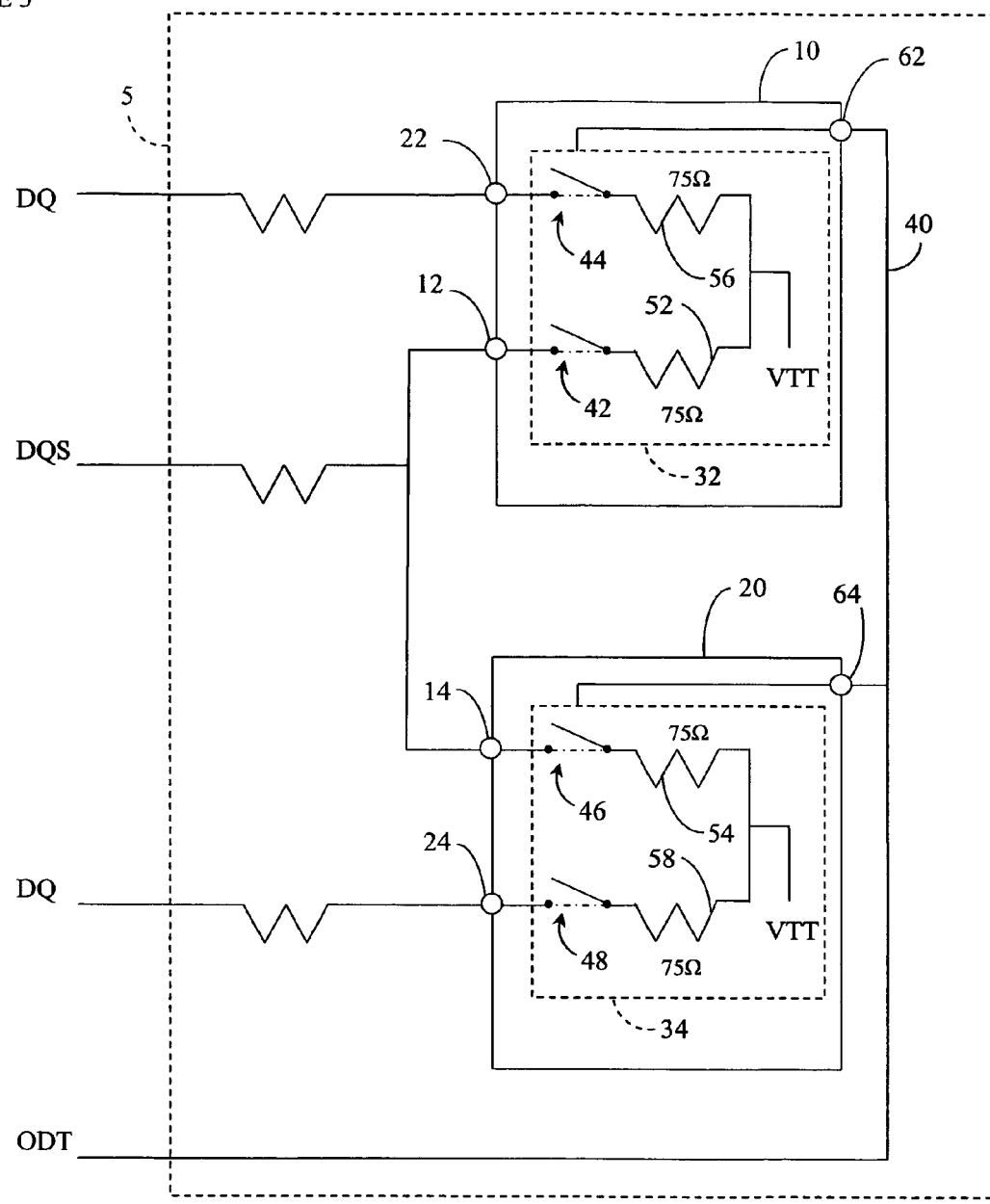
FIG. 3 schematically illustrates another exemplary memory module in which a DQS pin of a first memory component is connected to a DQS pin of a second memory component.

A second problem may also arise from tying together two output signal pins. FIG. 3 schematically illustrates another exemplary memory module 5 in which a first DQS pin 12 of a first memory component 10 is electrically connected to a second DQS pin 14 of a second memory component 20. The two DQS pins 12, 14 of FIG. 3 are both electrically connected to a memory controller (not shown). The DQ (data input/output) pin 22 of the first memory component 10 and the corresponding DQ pin 24 of the second memory component 20 are each electrically connected to the memory controller by the DQ bus (not shown). Typically, each memory component 10, 20 will have a plurality of DQ pins (e.g., eight DQ pins per memory component), but for simplicity, FIG. 3 only shows one DQ pin for each memory component 10, 20.

Each of the memory components 10, 20 of FIG. 3 utilizes a respective on-die termination or "ODT" circuit 32, 34 which has termination resistors (e.g., 75 ohms) internal to the memory components 10, 20 to provide signal termination. Each memory component 10, 20 has a corresponding ODT signal pin 62, 64 which is electrically connected to the memory controller via an ODT bus 40. The ODT signal pin 62 of the first memory component 10 receives a signal from the ODT bus 40 and provides the signal to the ODT circuit 32 of the first memory component 10. The ODT circuit 32 responds to the signal by selectively enabling or disabling the internal termination resistors 52, 56 of the first memory component 10. This behavior is shown schematically in FIG. 3 by the switches 42, 44 which are either closed (dash-dot line) or opened (solid line). The ODT signal pin 64 of the second memory component 20 receives a signal from the ODT bus 40 and provides the signal to the ODT circuit 34 of the second memory component 20. The ODT circuit 34 responds to the signal by selectively enabling or disabling the internal termination resistors 54, 58 of the second memory component 20. This behavior is shown schematically in FIG. 3 by the switches 46, 48 which are either closed (dash-dot line) or opened (solid line). The switches 42, 44, 46, 48 of FIG. 3 are schematic representations of the operation of the ODT circuits 32, 34, and do not signify that the ODT circuits 32, 34 necessarily include mechanical switches.

Examples of memory components 10, 20 which include such ODT circuits 32, 34 include, but are not limited to, DDR-2 memory components. Such memory components are configured to selectively enable or disable the termination of the memory component in this way in response to signals applied to the ODT signal pin of the memory component. For example, when the ODT signal pin 62 of the first memory component 10 is pulled high, the termination resistors 52, 56 of the first memory component 10 are enabled. When the ODT signal pin 62 of the first memory component 10 is pulled low (e.g., grounded), the termination resistors 52, 56 of the first memory component 10 are disabled. By selectively disabling the termination resistors of an active memory component, while leaving the termination resistors of inactive memory components enabled, such configurations advantageously preserve signal strength on the active memory component while continuing to eliminate signal reflections at the bus-die interface of the inactive memory components.

In certain configurations, as schematically illustrated by FIG. 3, the DQS pins 12, 14 of each memory component 10, 20 are selectively connected to a voltage VTT through a corresponding termination resistor 52, 54 internal to the corresponding memory component 10, 20. Similarly, in certain configurations, as schematically illustrated by FIG. 3, the DQ pins 22, 24 are selectively connected to a voltage VTT through a corresponding termination resistor 56, 58 internal to the corresponding memory component 10, 20. In certain configurations, rather than being connected to a voltage VTT, the DQ pins 12, 14 and/or the DQS pins 22, 24 are selectively connected to ground through the corresponding termination resistors 52, 54, 56, 58. The resistances of the internal termination resistors 52, 54, 56, 58 are selected to clamp the voltages so as to reduce the signal reflections from the corresponding pins. In the configuration schematically illustrated by FIG. 3, each internal termination resistor 52, 54, 56, 58 has a resistance of approximately 75 ohms.

When connecting the first memory component 10 and the second memory component 20 together to form a double word width, both the first memory component 10 and the second memory component 20 are enabled at the same time (e.g., by a common CS signal). Connecting the first memory component 10 and the second memory component 20 by tying the DQS pins 12, 14 together, as shown in FIG. 3, results in a reduced effective termination resistance for the DQS pins 12, 14. For example, for the exemplary configuration of FIG. 3, the effective termination resistance for the DQS pins 12, 14 is approximately 37.5 ohms, which is one-half the desired ODT resistance (for 75-ohm internal termination resistors) to reduce signal reflections since the internal termination resistors 52, 54 of the two memory components 10, 20 are connected in parallel. This reduction in the termination resistance can result in signal reflections causing the memory component to malfunction.

Figure 4:
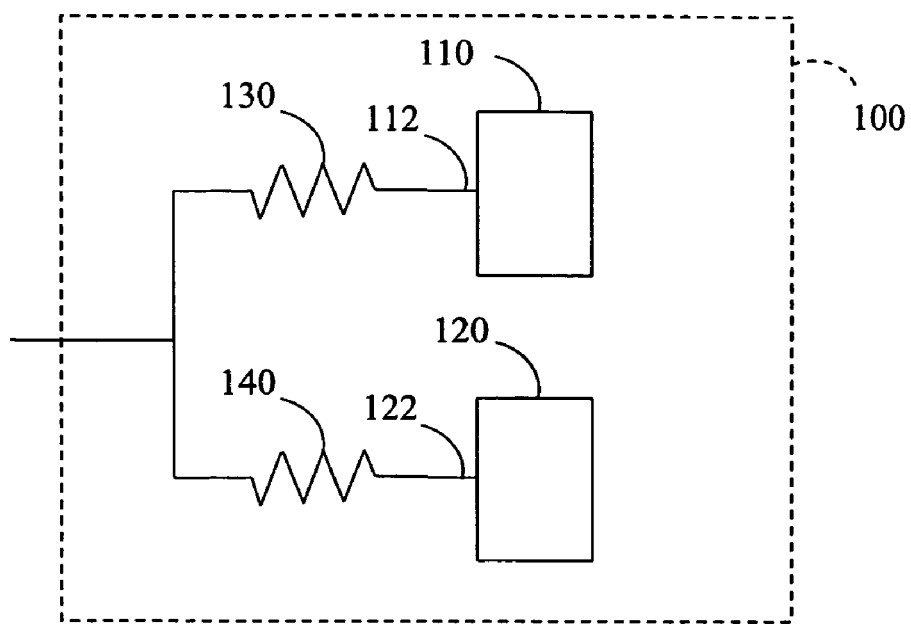
FIG. 4 schematically illustrates an exemplary memory module in accordance with certain embodiments described herein.

FIG. 4 schematically illustrates an exemplary memory module 100 in accordance with certain embodiments described herein. The memory module 100 comprises a first memory component 110 having a first data strobe (DQS) pin 112 and a second memory component 120 having a second data strobe (DQS) pin 122. The memory module 100 further comprises a first resistor 130 electrically coupled to the first DQS pin 112. The memory module 100 further comprises a second resistor 140 electrically coupled to the second DQS pin 122 and to the first resistor 130. The first DQS pin 112 is electrically coupled to the second DQS pin 122 through the first resistor 130 and through the second resistor 140.

Various types of memory modules 100 are compatible with embodiments described herein having the first resistor 130 and the second resistor 140. For example, memory modules 100 having memory capacities of 512-MB, 1-GB, 2-GB, 4-GB, 8-GB, as well as other capacities, are compatible with embodiments described herein. In addition, memory modules 100 having widths of 4 bytes, 8 bytes, 16 bytes, 32 bytes, or 32 bits, 64 bits, 128 bits, 256 bits, as well as other widths (in bytes or in bits), are compatible with embodiments described herein. Furthermore, memory modules 100 compatible with embodiments described herein include, but are not limited to, single in-line memory modules (SIMMs), dual in-line memory modules (DIMMs), small-outline DIMMs (SO-DIMMs), unbuffered DIMMs (UDIMMs), registered DIMMs (RDIMMs), mini-DIMMs, and micro-DIMMs.

Memory components 110, 120 compatible with embodiments described herein, including but not limited to, random-access memory (RAM), dynamic random-access memory (DRAM), synchronous DRAM (SDRAM), and double-data-rate DRAM (e.g., DDR-1, DDR-2, DDR-3). In addition, memory components having bit widths of 4, 8, 16, 32, as well as other bit widths, are compatible with embodiments described herein. Memory components 110, 120 compatible with embodiments described herein have packaging which include but are not limited to, thin small-outline package (TSOP), ball-grid-array (BGA), fine-pitch BGA (FBGA), micro-BGA (μBGA), mini-BGA (mBGA), and chip-scale packaging (CSP). Memory components compatible with embodiments described herein are available from a number of sources, including but not limited to, Samsung Semiconductor, Inc. of San Jose, Calif., Infineon Technologies AG of San Jose, Calif., and Micron Technology, Inc. of Boise, Id.

Figure 5A:
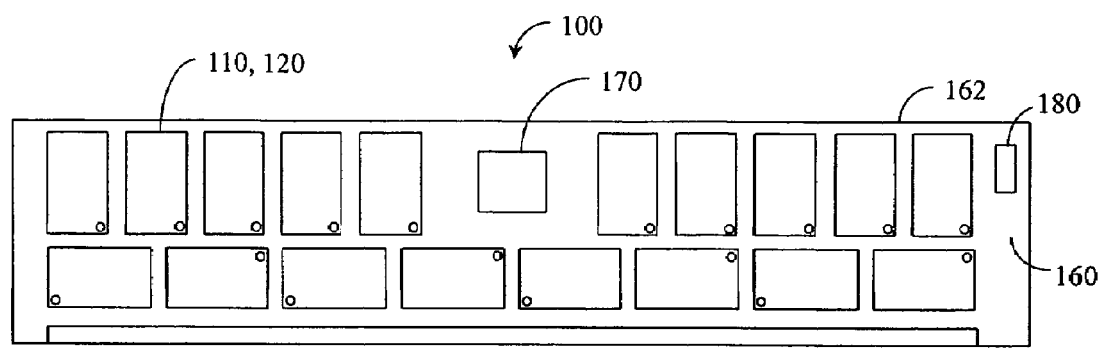
FIGS. 5A and 5B schematically illustrate a first side and a second side, respectively, of a memory module with eighteen 64M 4 bit, DDR-1 SDRAM FBGA memory components on each side of a 184-pin glass-epoxy printed circuit board.
Figure 5B:
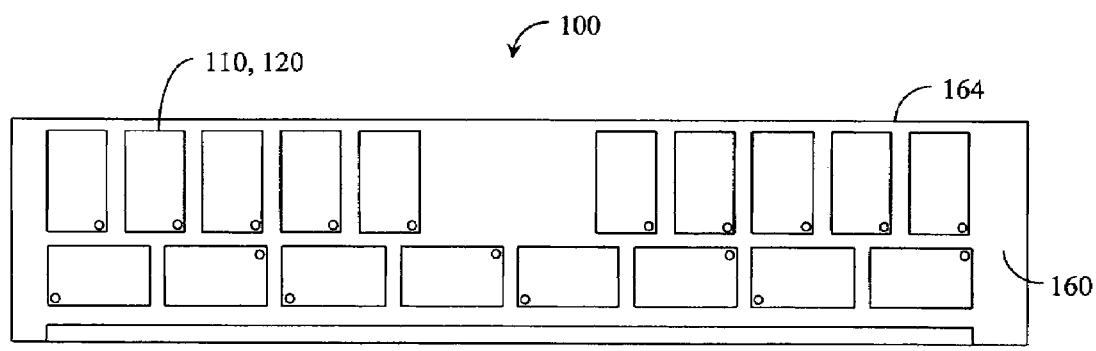

In certain embodiments, the memory module 100 is a 1-GB unbuffered Double Data Rate (DDR) Synchronous Dynamic RAM (SDRAM) high-density dual in-line memory module (DIMM). FIGS. 5A and 5B schematically illustrate a first side 162 and a second side 164, respectively, of such a memory module 100 with eighteen 64M 4-bit, DDR-1 SDRAM FBGA memory components on each side of a 184-pin glass-epoxy printed circuit board (PCB) 160. In certain embodiments, the memory module 100 further comprises a phase-lock-loop (PLL) clock driver 170, an EEPROM for serial-presence detect (SPD) data 180, and decoupling capacitors (not shown) mounted on the PCB in parallel to suppress switching noise on VDD and VDDQ power supply for DDR-1 SDRAM. By using synchronous design, such memory modules 100 allow precise control of data transfer between the memory module 100 and the system controller. Data transfer can take place on both edges of the DQS signal at various operating frequencies and programming latencies. Therefore, certain such memory modules 100 are suitable for a variety of high-performance system applications.

In certain embodiments, the memory module 100 comprises a plurality of memory components configured in pairs, each pair having a first memory component 110 and a second memory component 120. For example, in certain embodiments, a 128M 72-bit DDR SDRAM high-density memory module 100 comprises thirty-six 64M 4-bit DDR-1 SDRAM integrated circuits in FBGA packages configured in eighteen pairs. The first memory component 110 of each pair has the first DQS pin 112 electrically coupled to the second DQS pin 122 of the second memory component 120 of the pair. In addition, the first DQS pin 112 and the second DQS pin 122 are concurrently active when the first memory component 110 and the second memory component 120 are concurrently enabled.

In certain embodiments, the first resistor 130 and the second resistor 140 each has a resistance advantageously selected to reduce the current flow between the first DQS pin 112 and the second DQS pin 122 while allowing signals to propagate between the memory controller and the DQS pins 112, 122. In certain embodiments, each of the first resistor 130 and the second resistor 140 has a resistance in a range between approximately 5 ohms and approximately 50 ohms. For example, in certain embodiments, each of the first resistor 130 and the second resistor 140 has a resistance of approximately 22 ohms. Other resistance values for the first resistor 130 and the second resistor 140 are also compatible with embodiments described herein. In certain embodiments, the first resistor 130 comprises a single resistor, while in other embodiments, the first resistor 130 comprises a plurality of resistors electrically coupled together in series and/or in parallel. Similarly, in certain embodiments, the second resistor 140 comprises a single resistor, while in other embodiments, the second resistor 140 comprises a plurality of resistors electrically coupled together in series and/or in parallel.

Figure 6A:
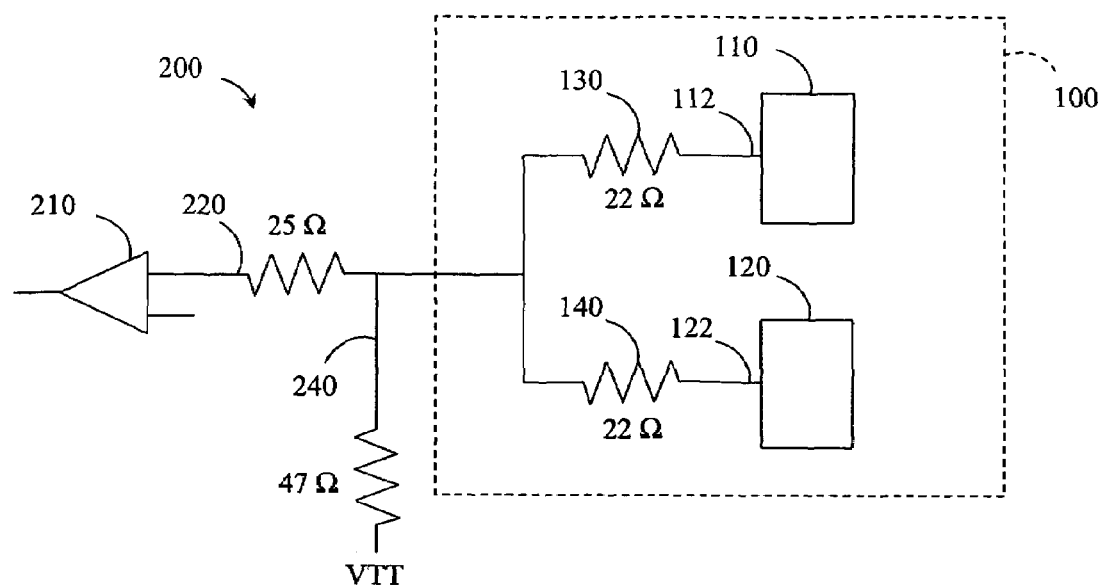
FIGS. 6A and 6B schematically illustrate an exemplary embodiment of a memory module in which a first resistor and a second resistor are used to reduce the current flow between the first DQS pin and the second DQS pin.
Figure 6B:
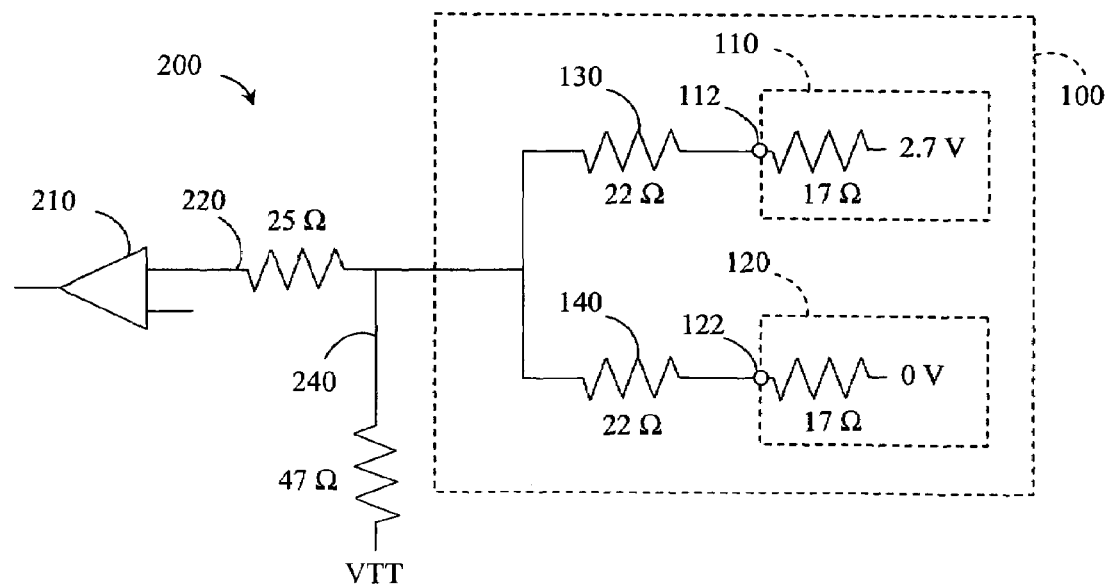

FIGS. 6A and 6B schematically illustrate an exemplary embodiment of a memory module 100 in which the first resistor 130 and the second resistor 140 are used to reduce the current flow between the first DQS pin 112 and the second DQS pin 122. As schematically illustrated by FIG. 6A, the memory module 100 is part of a computer system 200 having a memory controller 210. The first resistor 130 has a resistance of approximately 22 ohms and the second resistor 140 has a resistance of approximately 22 ohms. The first resistor 130 and the second resistor 140 are electrically coupled in parallel to the memory controller 210 through a signal line 220 having a resistance of approximately 25 ohms. The first resistor 130 and the second resistor 140 are also electrically coupled in parallel to a source of a fixed termination voltage (identified by VTT in FIGS. 6A and 6B) by a signal line 240 having a resistance of approximately 47 ohms. Such an embodiment can advantageously be used to allow two memory components having lower bit widths (e.g., 4-bit) to behave as a single virtual memory component having a higher bit width (e.g., 8-bit).

FIG. 6B schematically illustrates exemplary current-limiting resistors 130, 140 in conjunction with the impedances of the memory components 110, 120. During an exemplary portion of a data read operation, the memory controller 210 is in a high-impedance condition, the first memory component 110 drives the first DQS pin 112 high (e.g., 2.7 volts), and the second memory component 120 drives the second DQS pin 122 low (e.g., 0 volts). The amount of time for which this condition occurs is approximated by the time between $t_2$ and $t_3$ of FIG. 2, which in certain embodiments is approximately twice the tDQSQ (data strobe edge to output data edge skew time, e.g., approximately 0.8 nanoseconds). At least a portion of this time in certain embodiments is caused by simultaneous switching output (SSO) effects.

In certain embodiments, as schematically illustrated by FIG. 6B, the DQS driver of the first memory component 110 has a driver impedance $R_1$ of approximately 17 ohms, and the DQS driver of the second memory component 120 has a driver impedance $R_4$ of approximately 17 ohms. Because the upper network of the first memory component 110 and the first resistor 130 (with a resistance $R_2$ of approximately 22 ohms) is approximately equal to the lower network of the second memory component 120 and the second resistor 140 (with a resistance $R_3$ of approximately 22 ohms), the voltage at the midpoint is approximately 0.5*(2.7−0)=1.35 volts, which equals VTT, such that the current flow across the 47-ohm resistor of FIG. 6B is approximately zero.

The voltage at the second DQS pin 122 in FIG. 6B is given by $V_{DQS2}=2.7*R_4/(R_1+R_2+R_3+R_4)=0.59$ volts and the current flowing through the second DQS pin 122 is given by $I_{DQS2}=0.59/R_4=34$ milliamps. The power dissipation in the DQS driver of the second memory component 120 is thus $P_{DQS2}=34$ mA*0.59 V=20 milliwatts. In contrast, without the first resistor 130 and the second resistor 140, only the 17-ohm impedances of the two memory components 110, 120 would limit the current flow between the two DQS pins 112, 122, and the power dissipation in the DQS driver of the second memory component 120 would be approximately 107 milliwatts. Therefore, the first resistor 130 and the second resistor 140 of FIGS. 6A and 6B advantageously limit the current flowing between the two memory components during the time that the DQS pin of one memory component is driven high and the DQS pin of the other memory component is driven low.

In certain embodiments in which there is overshoot or undershoot of the voltages, the amount of current flow can be higher than those expected for nominal voltage values. Therefore, in certain embodiments, the resistances of the first resistor 130 and the second resistor 140 are advantageously selected to account for such overshoot/undershoot of voltages.

For certain such embodiments in which the voltage at the second DQS pin 122 is $V_{DQS2}=0.59$ volts and the duration of the overdrive condition is approximately 0.8 nanoseconds at maximum, the total surge is approximately 0.59 V*1.2 ns=0.3 V-ns. For comparison, the JEDEC standard for overshoot/undershoot is 2.4 V-ns, so certain embodiments described herein advantageously keep the total surge within predetermined standards (e.g., JEDEC standards).

Figure 7:
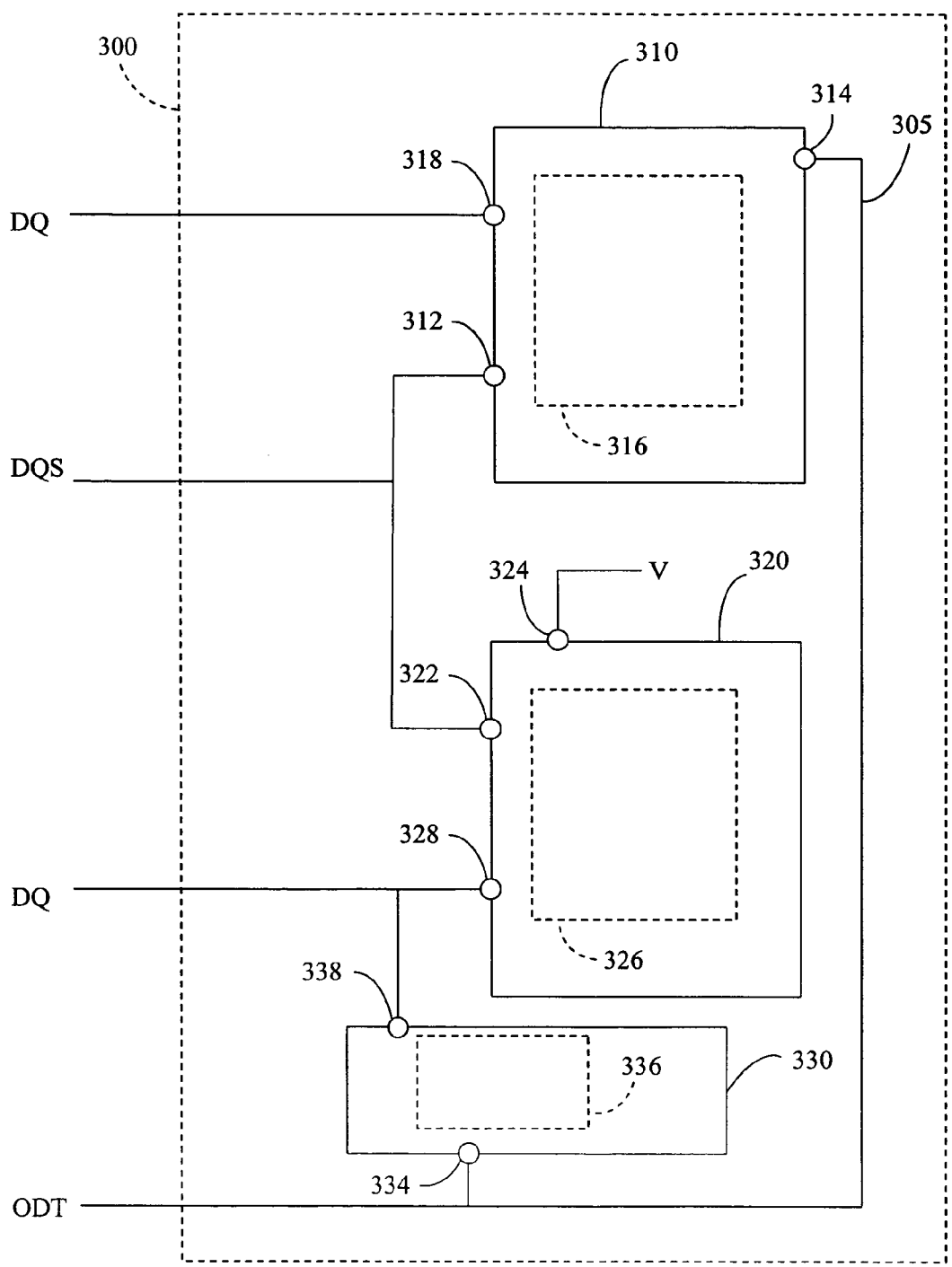
FIG. 7 schematically illustrates another exemplary memory module compatible with certain embodiments described herein.

FIG. 7 schematically illustrates another exemplary memory module 300 compatible with certain embodiments described herein. The memory module 300 comprises a termination bus 305. The memory module 300 further comprises a first memory component 310 having a first data strobe pin 312, a first termination signal pin 314 electrically coupled to the termination bus 305, a first termination circuit 316, and at least one data pin 318. The first termination circuit 316 selectively electrically terminating the first data strobe pin 312 and the first data pin 318 in response to a first signal received by the first termination signal pin 314 from the termination bus 305. The memory module 300 further comprises a second memory component 320 having a second data strobe pin 322 electrically coupled to the first data strobe pin 312, a second termination signal pin 324, a second termination circuit 326, and at least one data pin 328. The second termination signal pin 324 is electrically coupled to a voltage, wherein the second termination circuit 326 is responsive to the voltage by not terminating the second data strobe pin 322 or the second data pin 328. The memory module 300 further comprises at least one termination assembly 330 having a third termination signal pin 334, a third termination circuit 336, and at least one termination pin 338 electrically coupled to the data pin 328 of the second memory component 320. The third termination signal pin 334 is electrically coupled to the termination bus 305. The third termination circuit 336 selectively electrically terminates the data pin 328 of the second memory component 320 through the termination pin 338 in response to a second signal received by the third termination signal pin 334 from the termination bus 305.

Various types of memory modules 300 are compatible with embodiments described herein having the termination assembly 330 which provides termination to the data pin 328 of the second memory component 320. For example, memory modules 300 having memory capacities of 512-MB, 1-GB, 2-GB, 4-GB, 8-GB, as well as other capacities, are compatible with embodiments described herein. In addition, memory modules 300 having widths of 4 bytes, 8 bytes, 16 bytes, 32 bytes, or 32 bits, 64 bits, 128 bits, 256 bits, as well as other widths (in bytes or in bits), are compatible with embodiments described herein. Furthermore, memory modules 300 compatible with embodiments described herein include, but are not limited to, single in-line memory modules (SIMMs), dual in-line memory modules (DIMMs), small-outline DIMMs (SO-DIMMs), unbuffered DIMMs (UDIMMs), registered DIMMs (RDIMMs), mini-DIMMs, and micro-DIMMs.

Memory components 310, 320 compatible with embodiments described herein, including but not limited to, random-access memory (RAM), dynamic random-access memory (DRAM), synchronous DRAM (SDRAM), and double-data-rate DRAM (e.g., DDR1, DDR2, DDR3). In addition, memory components having bit widths of 4, 8, 16, 32, as well as other bit widths, are compatible with embodiments described herein. Memory components 310, 320 compatible with embodiments described herein have packaging which include but are not limited to, thin small-outline package (TSOP), ball-grid-array (BGA), fine-pitch BGA (FBGA), micro-BGA (μBGA), mini-BGA (mBGA), and chip-scale packaging (CSP). Memory components compatible with embodiments described herein are available from a number of sources, including but not limited to, Samsung Semiconductor, Inc. of San Jose, Calif., Infineon Technologies AG of San Jose, Calif., and Micron Technology, Inc. of Boise, Id.

Figure 8:
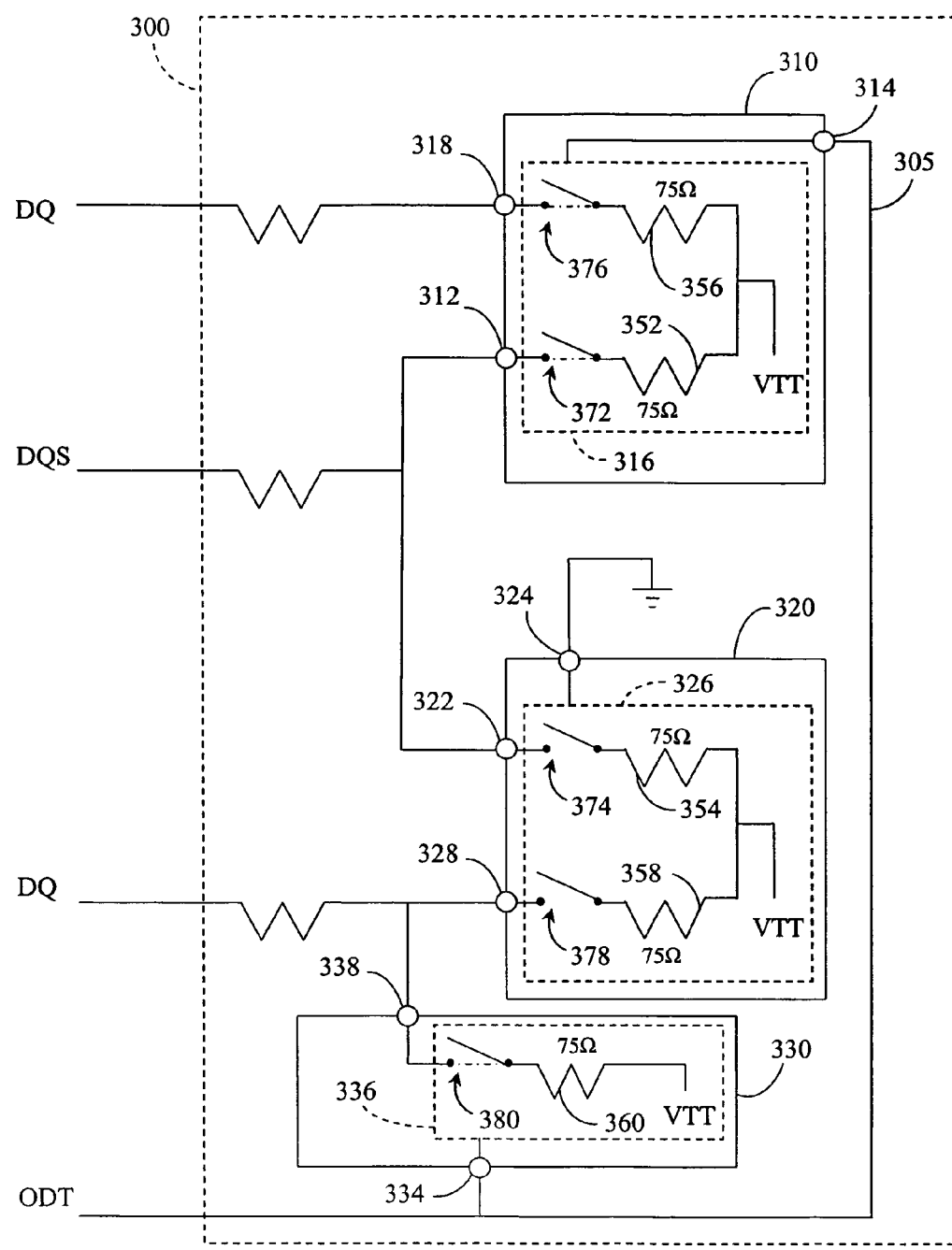
FIG. 8 schematically illustrates a particular embodiment of the memory module schematically illustrated by FIG. 7.

FIG. 8 schematically illustrates a particular embodiment of the memory module 300 schematically illustrated by FIG. 7. The memory module 300 comprises an on-die termination (ODT) bus 305. The memory module 300 comprises a first memory component 310 having a first data strobe (DQS) pin 312, a first ODT signal pin 314 electrically coupled to the ODT bus 305, a first ODT circuit 316, and at least one data (DQ) pin 318. The first ODT circuit 316 selectively electrically terminates the first DQS pin 312 and the DQ pin 318 of the first memory component 310 in response to an ODT signal received by the first ODT signal pin 314 from the ODT bus 305. This behavior of the first ODT circuit 316 is schematically illustrated in FIG. 8 by the switches 372, 376 which are selectively closed (dash-dot line) or opened (solid line).

The memory module 300 further comprises a second memory component 320 having a second DQS pin 322 electrically coupled to the first DQS pin 312, a second ODT signal pin 324, a second ODT circuit 326, and at least one DQ pin 328. The first DQS pin 312 and the second DQS pin 322 are concurrently active when the first memory component 310 and the second memory component 320 are concurrently enabled. The second ODT signal pin 324 is electrically coupled to a voltage (e.g., ground), wherein the second ODT circuit 326 is responsive to the voltage by not terminating the second DQS pin 322 or the second DQ pin 324. This behavior of the second ODT circuit 326 is schematically illustrated in FIG. 8 by the switches 374, 378 which are opened.

The memory module 300 further comprises at least one termination assembly 330 having a third ODT signal pin 334 electrically coupled to the ODT bus 305, a third ODT circuit 336, and at least one termination pin 338 electrically coupled to the DQ pin 328 of the second memory component 320. The third ODT circuit 336 selectively electrically terminates the DQ pin 328 of the second memory component 320 through the termination pin 338 in response to an ODT signal received by the third ODT signal pin 334 from the ODT bus 305. This behavior of the third ODT circuit 336 is schematically illustrated in FIG. 8 by the switch 380 which is either closed (dash-dot line) or opened (solid line).

In certain embodiments, the termination assembly 330 comprises discrete electrical components which are surface-mounted or embedded on the printed-circuit board of the memory module 300. In certain other embodiments, the termination assembly 330 comprises an integrated circuit mounted on the printed-circuit board of the memory module 300. Persons skilled in the art can provide a termination assembly 330 in accordance with embodiments described herein.

Certain embodiments of the memory module 300 schematically illustrated by FIG. 8 advantageously avoid the problem schematically illustrated by FIG. 3 of electrically connecting the internal termination resistances of the DQS pins of the two memory components in parallel. As described above in relation to FIG. 3, FIGS. 7 and 8 only show one DQ pin for each memory component for simplicity. Other embodiments have a plurality of DQ pins for each memory component. In certain embodiments, each of the first ODT circuit 316, the second ODT circuit 326, and the third ODT circuit 336 are responsive to a high voltage or signal level by enabling the corresponding termination resistors and are responsive to a low voltage or signal level (e.g., ground) by disabling the corresponding termination resistors. In other embodiments, each of the first ODT circuit 316, the second ODT circuit 326, and the third ODT circuit 336 are responsive to a high voltage or signal level by disabling the corresponding termination resistors and are responsive to a low voltage or signal level (e.g., ground) by enabling the corresponding termination resistors. Furthermore, the switches 372, 374, 376, 378, 380 of FIG. 8 are schematic representations of the enabling and disabling operation of the ODT circuits 316, 326, 336 and do not signify that the ODT circuits 316, 326, 336 necessarily include mechanical switches.

The first ODT signal pin 314 of the first memory component 310 receives an ODT signal from the ODT bus 305. In response to this ODT signal, the first ODT circuit 316 selectively enables or disables the termination resistance for both the first DQS pin 312 and the DQ pin 318 of the first memory component 310. The second ODT signal pin 324 of the second memory component 320 is tied (e.g., directly hard-wired) to the voltage (e.g., ground), thereby disabling the internal termination resistors 354, 358 on the second DQS pin 322 and the second DQ pin 328, respectively, of the second memory component 320 (schematically shown by open switches 374, 378 in FIG. 8). The second DQS pin 322 is electrically coupled to the first DQS pin 312, so the termination resistance for both the first DQS pin 312 and the second DQS pin 322 is provided by the termination resistor 352 internal to the first memory component 310.

The termination resistor 356 of the DQ pin 318 of the first memory component 310 is enabled or disabled by the ODT signal received by the first ODT signal pin 314 of the first memory component 310 from the ODT bus 305. The termination resistance of the DQ pin 328 of the second memory component 320 is enabled or disabled by the ODT signal received by the third ODT signal pin 334 of the termination assembly 330 which is external to the second memory component 320. Thus, in certain embodiments, the first ODT signal pin 314 and the third ODT signal pin 334 receive the same ODT signal from the ODT bus 305, and the termination resistances for both the first memory component 310 and the second memory component 320 are selectively enabled or disabled in response thereto when these memory components are concurrently enabled. In this way, certain embodiments of the memory module 300 schematically illustrated by FIG. 8 provides external or off-chip termination of the second memory component 320.

Certain embodiments of the memory module 300 schematically illustrated by FIG. 8 advantageously allow the use of two lower-cost readily-available 512-Mb DDR-2 SDRAM components to provide the capabilities of a more expensive 1-GB DDR-2 SDRAM component. Certain such embodiments advantageously reduce the total cost of the resultant memory module 300.

Figure 9:
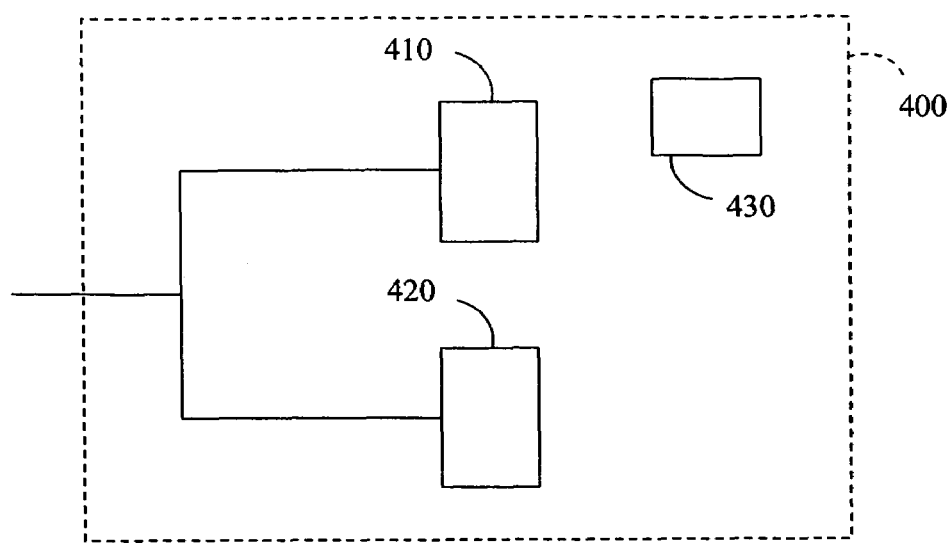
FIG. 9 schematically illustrates another exemplary memory module in accordance with certain embodiments described herein.

FIG. 9 schematically illustrates another exemplary memory module 400 in accordance with certain embodiments described herein. The memory module 400 comprises a pair of substantially identical memory components 410, 420. Each memory component 410, 420 has a first bit width, a first number of banks of memory locations, a first number of rows of memory locations, and a first number of columns of memory locations. The memory module 400 further comprises a serial-presence-detect (SPD) device 430 comprising data that characterizes the pair of memory components 410, 420. The data characterize the pair of memory components 410, 420 as a virtual memory component having a second bit width equal to twice the first bit width, a second number of banks of memory locations equal to the first number of banks, a second number of rows of memory locations equal to the first number of rows, and a second number of columns of memory locations equal to the first number of columns.

Table 1 provides the numbers of rows and columns for various memory components as specified by JEDEC standard JESD79D, "Double Data Rate(DDR) SDRAM Specification," published Feb. 2004, and incorporated in ets entirety by reference herein.

|  | 128-Mb | 256-Mb | 512-Mb | 1-Gb |
| --- | --- | --- | --- | --- |
| Number of banks | 4 | 4 | 4 | 4 |
| Number of row address bits | 12 | 13 | 13 | 14 |
| Number of column address bits for "x4" configuration | 11 | 11 | 12 | 12 |
| Number of column address bits for "x8" configuration | 10 | 10 | 11 | 11 |
| Number of column address bits for "x16" configuration | 9 | 9 | 10 | 10 |

As described by Table 1, 512-Mb (128M 4-bit) DRAM devices have $2^{13}$ rows and $2^{12}$ columns of memory locations, while 1-Gb (128M 8-bit) DRAM devices have $2^{14}$ rows and $2^{11}$ columns of memory locations. Because of the differences in the number of rows and the number of columns for the two types of memory components, complex address translation procedures and structures would typically be needed to fabricate a 1-GB (128M 8-byte) memory module using sixteen 512-Mb (128M 4-bit) DRAM devices.

Certain embodiments described herein provide an apparatus and method for utilizing two lower-density (e.g., 512-Mb) memory components to simulate one higher-density (e.g., 1-Gb) memory component without utilizing address translation procedures or structures. In certain embodiments, the apparatus and method described herein are useful for memory modules comprising a plurality of memory components mounted (e.g., soldered) on a printed circuit board (PCB).

Such memory modules generally include serial-presence-detect (SPD) data stored in an SPD device, such as a serial electrically-erasable, programmable, read-only memory (EEPROM) device, mounted on the PCB. This SPD data contains relevant information on the memory module, such as the number of row addresses, the number of column addresses, and the data width of each memory component. From the SPD data, the total memory capacity of the memory module can be calculated. Upon booting a computer comprising the memory module, the SPD device provides the SPD data to the basic input/output system (BIOS). The BIOS then uses the SPD data to configure the computer memory properly for maximum reliability and performance.

For a commercially-available 512-MB (64M 8-byte) memory module utilizing eight 512-Mb memory components each with a 64M 8-bit configuration, as described above, the SPD device contains the following SPD data (in appropriate bit fields of these bytes):

Byte 3: Defines the number of row address bits in the DRAM device in the memory module [13 for the 512-Mb memory component].

Byte 4: Defines the number of column address bits in the DRAM device in the memory module [11 for the 512-Mb memory component].

Byte 13: Defines the bit width of the primary DRAM device used in the memory module [8 bits for the 512-Mb (64M 8-bit) memory component].

Byte 14: Defines the bit width of the error checking DRAM device used in the memory module [8 bits for the 512-Mb (64M 8-bit) memory component].

Byte 17: Defines the number of banks internal to the DRAM device used in the memory module [4 for the 512-Mb memory component].

Similarly, for a commercially-available 1-GB (128M 8-byte) memory module utilizing eight 1-Gb memory components each with a 128M 8-bit configuration, as described above, the SPD device contains the following SPD data (in appropriate bit fields of these bytes):

Byte 3: Defines the number of row address bits in the DRAM device in the memory module [14 for the 1-Gb memory component].

Byte 4: Defines the number of column address bits in the DRAM device in the memory module [11 for the 1-Gb memory component].

Byte 13: Defines the bit width of the primary DRAM device used in the memory module [8 bits for the 1-Gb (128M 8-bit) memory component].

Byte 14: Defines the bit width of the error checking DRAM device used in the memory module [8 bits for the 1-Gb (128M 8-bit) memory component].

Byte 17: Defines the number of banks internal to the DRAM device used in the memory module [4 for the 1-Gb memory component].

In certain embodiments disclosed herein, two lower-density memory components are used to simulate one higher-density memory component. In such embodiments, the SPD device of the memory module is programmed to describe the combined pair of lower-density memory components as one virtual or pseudo-higher-density memory component.

In an exemplary embodiment, two 512-Mb memory components, each with a 128M 4-bit configuration, are used to simulate one 1-Gb memory component having a 128M 8-bit configuration. The SPD device of the memory module is programmed to describe the pair of 512-Mb memory components as one virtual or pseudo-1-Gb memory component.

For example, to fabricate a 1-GB (128M 8-byte) memory module, sixteen 512-Mb (128M 4-bit) memory components can be used. The sixteen 512-Mb (128M 4-bit) memory components are combined in eight pairs, with each pair serving as a virtual or pseudo-1-Gb (128M 8-bit) memory component. In such embodiments, the SPD device contains the following SPD data (in appropriate bit fields of these bytes):

Byte 3: 13 row address bits.

Byte 4: 12 column address bits.

Byte 13: 8 bits wide for the primary virtual 1-Gb (128M 8-bit) memory component.

Byte 14: 8 bits wide for the error checking virtual 1-Gb (128M 8-bit) memory component.

Byte 17: 4 banks.

In this exemplary embodiment, bytes 3, 4, and 17 are programmed to have the same values as they would have for a 512-MB (128M 4-byte) memory module utilizing 512-Mb (128M 4-bit) memory components. However, bytes 13 and 14 of the SPD data are programmed to be equal to 8, corresponding to the bit width of the virtual or pseudo-higher-density 1-Gb (128M 8-bit) memory component, for a total capacity of 1-GB. Thus, the SPD data does not describe the actual-lower-density memory components, but instead describes the virtual or pseudo-higher-density memory components. The BIOS accesses the SPD data and recognizes the memory module as having 4 banks of memory locations arranged in $2^{13}$ rows and $2^{12}$ columns, with each memory location having a width of 8 bits rather than 4 bits.

Certain embodiments which utilize the SPD data as described herein also advantageously do not require hardware changes, since the configuration of the memory module is stored in software. In addition, certain embodiments described herein advantageously avoid the need for row and column steering logic circuits.

In certain embodiments, the memory density of a memory module is advantageously doubled by providing twice as many memory components as would otherwise be provided. For example, pairs of lower-density memory components can be substituted for individual higher-density memory components to reduce costs or to increase performance. As another example, twice the number of memory components can be used to produce a higher-density memory configuration of the memory module. Each of these examples can be limited by the number of chip select signals which are available from the memory controller or by the size of the memory components. Certain embodiments described herein advantageously provide a logic mechanism to overcome such limitations.

Figure 10A:
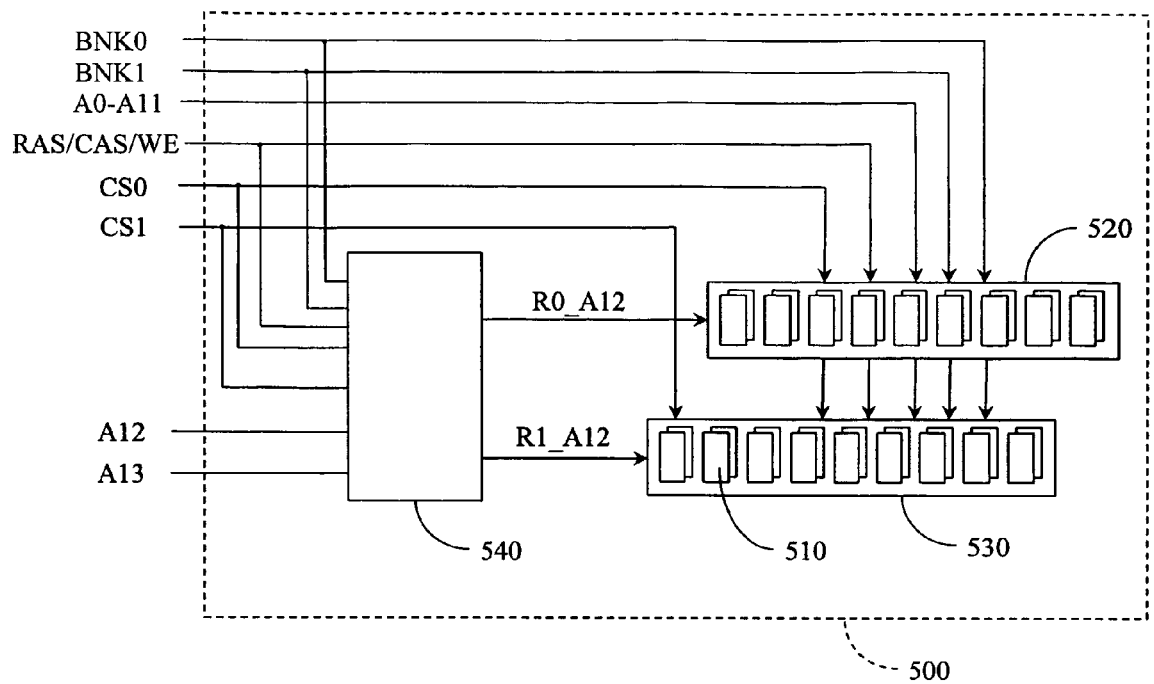
FIG. 10A schematically illustrates an exemplary memory module which doubles the rank density in accordance with certain embodiments described herein.

FIG. 10A schematically illustrates an exemplary memory module 500 which doubles the rank density in accordance with certain embodiments described herein. The memory module 500 has a a first memory capacity. The memory module 500 comprises a plurality of substantially identical memory components 510 configured as a first rank 520 and a second rank 530. The memory components 510 of the first rank 520 are configured in pairs with their respective DQS pins tied together, as described above. Similarly, the memory components 510 of the second rank 530 are also configured in pairs with their respective DQS pins tied together, as described above. The memory module 500 further comprises a logic element 540 which receives a first set of address and control signals from a memory controller (not shown). The first set of address and control signals is compatible with a second memory capacity substantially equal to one-half of the first memory capacity. The logic element 540 translates the first set of address and control signals into a second set of address and control signals which is compatible with the first memory capacity of the memory module 500 and which is transmitted to the first rank 520 and the second rank 530.

The first rank 520 of FIG. 10A has 18 memory components 510 and the second rank 530 of FIG. 10A has 18 memory components 510. Other numbers of memory components 510 in each of the ranks 520, 530 are also compatible with embodiments described herein.

In the embodiment schematically illustrated by FIG. 10A, the memory module 500 has a width of 8 bytes (or 64 bits) and each of the memory components 510 of FIG. 10A has a bit width of 4 bits. Other memory module widths (e.g., 4 bytes, 16 bytes, 32 bytes, or 32 bits, 128 bits, 256 bits) and other memory component bit widths (e.g., 2, 8, 16, 32) are also compatible with embodiments described herein. The 4-bit-wide ("×4") memory components 510 have one-half the width, but twice the depth of 8-bit-wide ("×8") memory components. Thus, each pair of "×4" memory components 510 has the same density as a single "×8" memory component, and pairs of "×4" memory components 510 can be used instead of individual "×8" memory components to provide the memory density of the memory module 500. For example, a pair of 512-Mb 128M 4-bit memory components has the same memory density as a 1-Gb 128M 8-bit memory component.

For two "×4" memory components 510 to work in tandem to mimic a "×8" memory component, the relative DQS pins of the two memory components 510 are advantageously tied together, as described above. In addition, to access the memory density of a high-density memory module 500 comprising pairs of "×4" memory components 510, an additional address line is used. While a high-density memory module comprising individual "×8" memory components with the next-higher density would also utilize an additional address line, the additional address lines are different in the two memory module configurations.

For example, a 1-Gb 128M 8-bit DDR-1 DRAM memory component uses row addresses A13-A0 and column addresses A11 and A9-A0. A pair of 512-Mb 128M 4-bit DDR-1 DRAM memory components uses row addresses A12-A0 and column addresses A12, A11, and A9-A0. In certain embodiments, a memory controller of a computer system utilizing a 1-GB 128M 8 memory module 500 comprising pairs of the 512-Mb 128M 4 memory components 510 supplies the address and control signals including the extra row address (A13) to the memory module 500. The logic element 540 receives the address and control signals from the memory controller and converts the extra row address (A13) into an extra column address (A12).

Figure 10B:
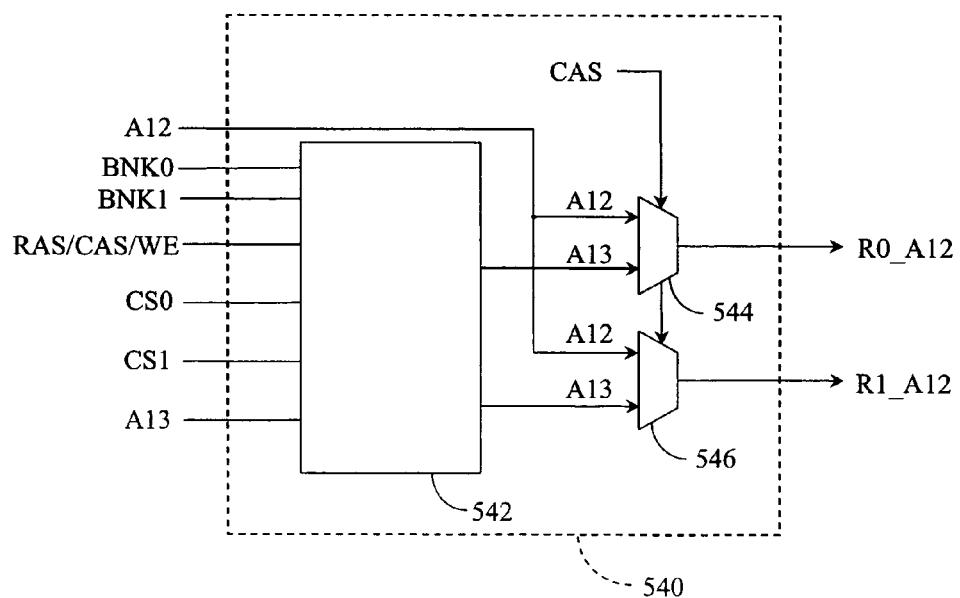
FIG. 10B schematically illustrates an exemplary logic element compatible with certain embodiments described herein.

FIG. 10B schematically illustrates an exemplary logic element 540 compatible with embodiments described herein. The logic element 540 is used for a memory module 500 comprising pairs of "×4" memory components 510 with their respective DQS pins tied together to mimic individual "×8" memory components, as described above. In certain embodiments, the logic element 540 comprises a programmable-logic device (PLD) 542, a first multiplexer 544 electrically coupled to the first rank 520 of memory components 510, and a second multiplexer 546 electrically coupled to the second rank 530 of memory components 510.

In certain embodiments, the PLD 542 comprises an application-specific integrated circuit (ASIC), a field-programmable gate array (FPGA), a custom-designed semiconductor device, or a complex programmable-logic device (CPLD). Sources of PLDs 542 compatible with embodiments described herein include, but are not limited to, Lattice Semiconductor Corporation of Hillsboro, Oreg., Altera Corporation of San Jose, Calif., and Xilinx Incorporated of San Jose, Calif. In certain embodiments, the PLD 542 and the first and second multiplexers 544, 546 are discrete elements, while in other certain embodiments, they are integrated within a single integrated circuit. Persons skilled in the art can select an appropriate PLD 542, first multiplexer 544, and second multiplexer 546 in accordance with embodiments described herein.

In the exemplary logic element 540 of FIG. 10B, during a row access procedure (CAS is high), the first multiplexer 544 passes the A12 address through to the first rank 520, the second multiplexer 546 passes the A12 address through to the second rank 530, and the PLD 542 saves or latches the A13 address from the memory controller. In certain embodiments, a copy of the A13 address is saved by the PLD 542 for each of the internal banks (e.g., 4 internal banks) per memory component 510. During a subsequent column access procedure (CAS is low), the first multiplexer 544 passes the previously-saved A13 address through to the first rank 520 as the A12 address and the second multiplexer 546 passes the previously-saved A13 address through to the second rank 530 as the A12 address. The first rank 520 and the second rank 530 thus interpret the previously-saved A13 row address as the current A12 column address. In this way, the logic element 540 translates the extra row address into an extra column address in accordance with certain embodiments described herein.

Thus, by allowing two lower-density memory components to be used rather than one higher-density memory component, certain embodiments described herein provide the advantage of using lower-cost, lower-density memory components to build "next-generation" higher-density memory modules. Certain embodiments advantageously allow the use of lower-cost readily-available 512-Mb DDR2 SDRAM components to replace more expensive 1-Gb DDR2 SDRAM components. Certain embodiments advantageously reduce the total cost of the resultant memory module.

Figure 11A:
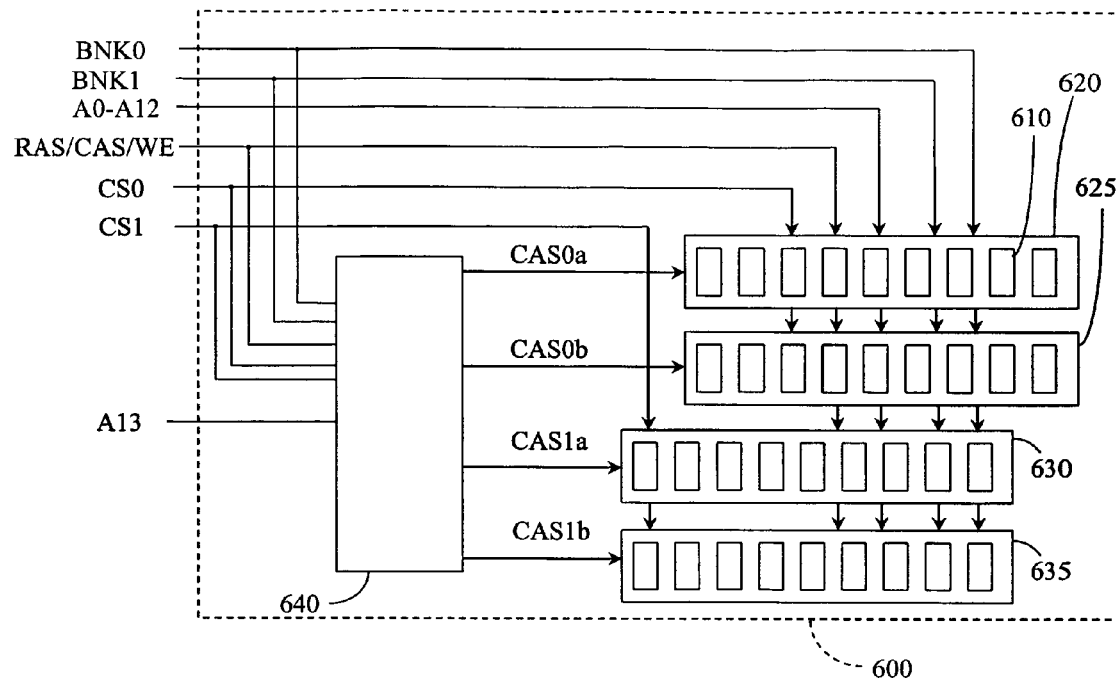
FIG. 11A schematically illustrates an exemplary memory module which doubles the number of ranks in accordance with embodiments described herein.

FIG. 11A schematically illustrates an exemplary memory module 600 which doubles number of ranks in accordance with certain embodiments described herein. The memory module 600 has a first plurality of memory locations with a first memory density. The memory module 600 comprises a plurality of substantially identical memory components 610 configured as a first rank 620, a second rank 625, a third rank 630, and a fourth rank 635. The memory module 600 further comprises a logic element 640 which receives a first set of address and control signals from a memory controller (not shown). The first set of address and control signals is compatible with a second plurality of memory locations having a second memory density. The second memory density is substantially equal to one-half of the first memory density. The logic element 640 translates the first set of address and control signals into a second set of address and control signals which is compatible with the first plurality of memory locations of the memory module 600 and which is transmitted to the first rank 620, the second rank 625, the third rank 630, and the fourth rank 635.

Each rank 620, 625, 630, 635 of FIG. 11A has 9 memory components 610. Other numbers of memory components 610 in each of the ranks 620, 625, 630, 635 are also compatible with embodiments described herein.

In the embodiment schematically illustrated by FIG. 11A, the memory module 600 has a width of 8 bytes (or 64 bits) and each of the memory components 610 of FIG. 11A has a bit width of 8 bits. Other memory module widths (e.g., 4 bytes, 16 bytes, 32 bytes, or 32 bits, 128 bits, 256 bits) and other memory component bit widths (e.g., 4, 16, 32) are also compatible with embodiments described herein. Because the memory module 600 has twice the number of 8-bit-wide ("×8") memory components 610 as does a standard 8-byte-wide memory module, the memory module 600 has twice the density as does a standard 8-byte-wide memory module. For example, a 1-GB 128M 8-byte memory module with 36 512-Mb 128M 8-bit memory components (arranged in four ranks) has twice the memory density as a 512-Mb 128M 8-byte memory module with 18 512-Mb 128M 8-bit memory components (arranged in two ranks).

Figure 11B:
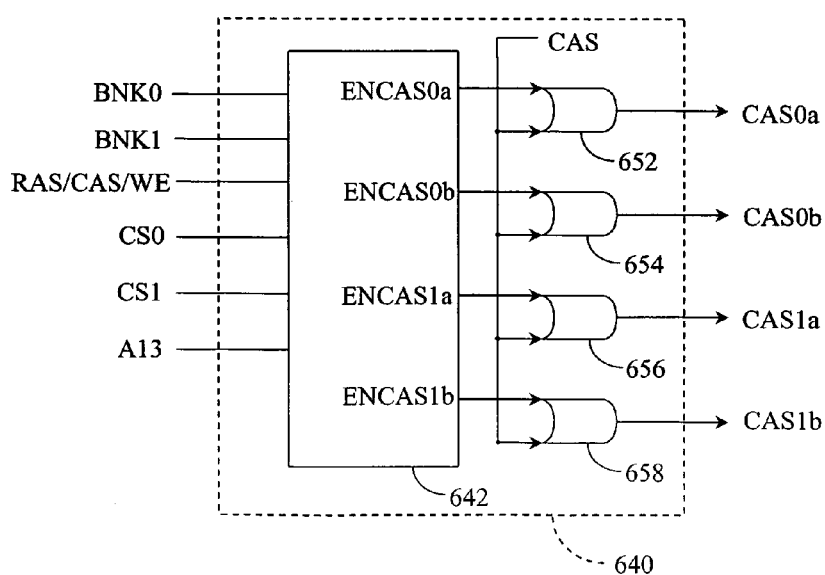
FIG. 11B schematically illustrates another exemplary logic element compatible with certain embodiments described herein.

To access the additional memory density of the high-density memory module 600, the two chip-select signals (CS0, CS1) are used with other address and control signals to gate a set of four gated CAS signals. For example, to access the additional ranks of four-rank 1-GB 128M 8-byte DDR1 DRAM memory module, the CS0 and CS1 signals along with the other address and control signals are used to gate the CAS signal appropriately, as schematically illustrated by FIG. 11A. FIG. 11B schematically illustrates an exemplary logic element 640 compatible with embodiments described herein. In certain embodiments, the logic element 640 comprises a programmable-logic device (PLD) 642 and four "OR" logic elements 652, 654, 656, 658 electrically coupled to corresponding ranks 620, 625, 630, 635 of memory components 610.

In certain embodiments, the PLD 642 comprises an ASIC, an FPGA, a custom-designed semiconductor device, or a CPLD. Sources of PLDs 642 compatible with embodiments described herein include, but are not limited to, Lattice Semiconductor Corporation of Hillsboro, Oreg., Altera Corporation of San Jose, Calif., and Xilinx Incorporated of San Jose, Calif. In certain embodiments, the PLD 642 and the four "OR" logic elements 652, 654, 656, 658 are discrete elements, while in other certain embodiments, they are integrated within a single integrated circuit. Persons skilled in the art can select an appropriate PLD 642 and appropriate "OR" logic elements 652, 654, 656, 658 in accordance with embodiments described herein.

In the embodiment schematically illustrated by FIG. 11B, the PLD 642 transmits each of the four "enabled CAS" (ENCAS0a, ENCAS0b, ENCAS1a, ENCAS1b) signals to a corresponding one of the "OR" logic elements 652, 654, 656, 658. The CAS signal is also transmitted to each of the four "OR" logic elements 652, 654, 656, 658. The CAS signal and the "enabled CAS" signals are "low" true signals. By selectively activating each of the four "enabled CAS" signals which are inputted into the four "OR" logic elements 652, 654, 656, 658, the PLD 642 is able to select which of the four ranks 620, 625, 630, 635 is active.

In certain embodiments, the PLD 642 uses sequential and combinatorial logic procedures to produce the gated CAS signals which are each transmitted to a corresponding one of the four ranks 620, 625, 630, 635. In certain other embodiments, the PLD 642 instead uses sequential and combinatorial logic procedures to produce four gated chip-select signals (e.g., CS0a, CS0b, CS1a, and CS1b) which are each transmitted to a corresponding one of the four ranks 620, 625, 630, 635.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A memory module having a first memory capacity, the memory module comprising:
   a plurality of substantially identical memory components configured as a first rank and a second rank, the memory components of the first rank configured in pairs, the memory components of each pair having their respective data strobe pins in electrical communication with one another, the memory components of the second rank configured in pairs, the memory components of each pair having their respective data strobe pins in electrical communication with one another;
   a logic element which receives a first set of address and control signals compatible with a second memory capacity, the second memory capacity substantially equal to one-half of the first memory capacity, wherein the logic element translates the first set of address and control signals into a second set of address and control signals compatible with the first memory capacity of the memory module, the logic element transmitting the second set of address and control signals to the first rank and the second rank; and
   a termination bus, each pair of memory components comprising a first memory component having a first data strobe pin, a first termination signal pin in electrical communication with the termination bus, a first termination circuit, and at least one data pin, wherein the first termination circuit selectively electrically terminates the first data strobe pin and the at least one data pin of the first memory component in response to a first signal received by the first termination signal pin from the termination bus.

2. The memory module of claim 1, wherein each pair of memory components comprises a second memory component having a second data strobe pin in electrical communication with the first data strobe pin, a second termination signal pin, a second termination circuit, and at least one data pin, wherein the second termination circuit is responsive to a voltage applied to the second termination signal pin by not terminating the second data strobe pin or the at least one data pin of the second memory component.

3. The memory module of claim 2, further comprising at least one termination assembly having a third termination signal pin, a third termination circuit, and at least one termination pin electrically coupled to the at least one data pin of the second memory component, the third termination signal pin in electrical communication with the termination bus, wherein the third termination circuit selectively electrically terminates the at least one data pin of the second memory component through the termination pin in response to a second signal received by the third termination signal pin from the termination bus.

4. The memory module of claim 3, wherein the first signal and the second signal are the same signal.

5. The memory module of claim 3, wherein the termination bus comprises an on-die termination (ODT) bus, and each of the first termination circuit, second termination circuit, and third termination circuit comprises an ODT circuit.

6. The memory module of claim 3, wherein the voltage is ground.

7. The memory module of claim 1, wherein the memory components of each pair of memory components has a first bit width and each pair of memory components simulates a single virtual memory component having a second bit width which is twice the first bit width.

8. The memory module of claim 7, wherein the first bit width is 4 bits, 8 bits, or 16 bits.

9. The memory module of claim 1, wherein each of the memory components comprises ball-grid-array (BGA) packaging.

10. The memory module of claim 9, wherein each of the memory components comprises fine-pitch BGA (FBGA) packaging.

11. The memory module of claim 1, wherein each of the memory components comprises a synchronous dynamic random-access memory (SDRAM) integrated circuit.

12. A memory module having a first memory capacity, the memory module comprising:
   a plurality of substantially identical memory components configured as a first rank and a second rank, the memory components of the first rank configured in pairs, the memory components of each pair having their respective data strobe pins in electrical communication with one another, the memory components of the second rank configured in pairs, the memory components of each pair having their respective data strobe pins in electrical communication with one another; and
   a logic element which receives a first set of address and control signals compatible with a second memory capacity, the second memory capacity substantially equal to one-half of the first memory capacity, wherein the logic element translates the first set of address and control signals into a second set of address and control signals compatible with the first memory capacity of the memory module, the logic element transmitting the second set of address and control signals to the first rank and the second rank, wherein each memory component has a first bit width, a first number of banks of memory locations, a first number of row address bits, and a first number of column address bits, the memory module further comprising a serial-presence-detect (SPD) device comprising data that characterizes each pair of memory components as a virtual memory component having a second bit width equal to twice the first bit width, a second number of banks of memory locations equal to the first number of banks, a second number of row address bits equal to the first number of row address bits, and a second number of column address bits equal to the first number of column address bits.

13. The memory module of claim 12, wherein byte 3 of the SPD data comprises the first number of row address bits, byte 4 of the SPD data comprises the first number of column address bits, byte 13 of the SPD data comprises the second bit width, byte 14 of the SPD data comprises the second bit width, and byte 17 of the SPD data comprises the first number of banks.

14. The memory module of claim 13, wherein the first bit width is 4 bits.

15. The memory module of claim 13, wherein the first bit width is 8 bits.

16. The memory module of claim 13, wherein the SPD device comprises an electrically-erasable programmable read-only memory (EEPROM) device.

17. The memory module of claim 12, wherein the memory module has a 1-GB (128M×8-byte) configuration, and comprises eight pairs of memory components, each memory component having a 512-Mb (128M×4-bit) configuration, wherein the second bit width is 8 bits, the first number of row address bits is 13, and the second number of column address bits is 12.

18. The memory module of claim 12, wherein each of the memory components comprises ball-grid-array (BGA) packaging.

19. The memory module of claim 18, wherein each of the memory components comprises fine-pitch BGA (FBGA) packaging.

20. The memory module of claim 12, wherein each of the memory components comprises a synchronous dynamic random-access memory (SDRAM) integrated circuit.

* * * * *

UNITED STATES PATENT AND TRADEMARK OFFICE
CERTIFICATE OF CORRECTION

PATENT NO. : 7,286,436 B2  
APPLICATION NO. : 11/075395  
DATED : October 23, 2007  
INVENTOR(S) : Bhakta et al.

It is certified that error appears in the above-identified patent and that said Letters Patent is hereby corrected as shown below:

At page 2, column 1, line 8, please delete "Research" and insert -- Revision --, therefor.

At column 1, lines 63-64, please delete "128M 8-byte" and insert -- 128M x 8-byte --, therefor.

At column 1, line 64, please delete "128M 64-bit" and insert -- 128M x 64-bit --, therefor.

At column 1, line 67, please delete "128M 8-byte" and insert -- 128M x 8-byte --, therefor.

At column 2, line 9, please delete "128M 4-byte" and insert -- 128M x 4-byte --, therefor.

At column 3, line 58, please delete "64M 4-bit" and insert -- 64M x 4-bit --, therefor.

At column 4, line 24, please delete "64M 8-bit" and insert -- 64M x 8-bit --, therefor.

At column 4, line 33, please delete "64M 4-bit" and insert -- 64M x 4-bit --, therefor.

At column 4, line 56, please delete "64M 4-bit" and insert -- 64M x 4-bit --, therefor.

At column 4, line 58, please delete "64M 8-bit" and insert -- 64M x 8-bit --, therefor.

At column 4, line 59, please delete "128M 8-byte" and insert -- 128M x 8-byte --, therefor.

At column 7, line 52, please delete "64M 4-bit" and insert -- 64M x 4-bit, --, therefor.

At column 8, line 5, please delete "128M 72-bit" and insert -- 128M x 72-bit --, therefor.

At column 8, line 6, please delete "64M 4-bit" and insert -- 64M x 4-bit --, therefor.

UNITED STATES PATENT AND TRADEMARK OFFICE
CERTIFICATE OF CORRECTION

PATENT NO.        : 7,286,436 B2
APPLICATION NO.   : 11/075395
DATED             : October 23, 2007
INVENTOR(S)       : Bhakta et al.

It is certified that error appears in the above-identified patent and that said Letters Patent is hereby corrected as shown below:

At column 12, line 51, please delete "ets" and insert -- its --, therefor.

At column 12, line 66, please delete "128M 4-bit" and insert -- 128M x 4-bit --, therefor.

At column 13, line 1, please delete "128M 8-bit" and insert -- 128M x 8-bit --, therefor.

At column 13, line 6, please delete "128M 8-byte" and insert -- 128M x 8-byte --, therefor.

At column 13, line 7, please delete "128M 4-bit" and insert -- 128M x 4-bit --, therefor.

At column 13, line 31, please delete "64M 8-byte" and insert -- 64M x 8-byte --, therefor.

At column 13, line 33, please delete "64M 8-bit" and insert -- 64M x 8-bit --, therefor.

At column 13, line 44, please delete "64M 8-bit" and insert -- 64M x 8-bit --, therefor.

At column 13, line 47, please delete "64M 8-bit" and insert -- 64M x 8-bit --, therefor.

At column 13, lines 51-52, please delete "128M 8-byte" and insert -- 128M x 8-byte --, therefor.

At column 13, line 53, please delete "128M 8-bit" and insert -- 128M x 8-bit --, therefor.

At column 13, line 64, please delete "128M 8-bit" and insert -- 128M x 8-bit --, therefor.

At column 13, line 67, please delete "128M 8-bit" and insert -- 128M x 8-bit --, therefor.

UNITED STATES PATENT AND TRADEMARK OFFICE
CERTIFICATE OF CORRECTION

PATENT NO.        : 7,286,436 B2
APPLICATION NO.   : 11/075395
DATED             : October 23, 2007
INVENTOR(S)       : Bhakta et al.

It is certified that error appears in the above-identified patent and that said Letters Patent is hereby corrected as shown below:

At column 14, line 12, please delete "128M 4-bit" and insert -- 128M x 4-bit --, therefor.

At column 14, line 13, please delete "128M 8-bit" and insert -- 128M x 8-bit --, therefor.

At column 14, line 17, please delete "128M 8-byte" and insert -- 128M x 8-byte --, therefor.

At column 14, line 18, please delete "128M 4-bit" and insert -- 128M x 4-bit --, therefor.

At column 14, line 19, please delete "128M 4-bit" and insert -- 128M x 4-bit --, therefor.

At column 14, line 21, please delete "128M 8-bit" and insert -- 128M x 8-bit --, therefor.

At column 14, lines 27-28, please delete "128M 8-bit" and insert -- 128M x 8-bit --, therefor.

At column 14, line 30, please delete "128M 8-bit" and insert -- 128M x 8-bit --, therefor.

At column 14, line 34, please delete "128M 4-byte" and insert -- 128M x 4-byte --, therefor.

At column 14, line 35, please delete "128M 4-bit" and insert -- 128M x 4-bit --, therefor.

At column 14, line 38, please delete "128M 8-bit" and insert -- 128M x 8-bit --, therefor.

UNITED STATES PATENT AND TRADEMARK OFFICE
CERTIFICATE OF CORRECTION

PATENT NO. : 7,286,436 B2
APPLICATION NO. : 11/075395
DATED : October 23, 2007
INVENTOR(S) : Bhakta et al.

It is certified that error appears in the above-identified patent and that said Letters Patent is hereby corrected as shown below:

At column 15, line 2, after "a" please delete "a" (second occurrence).

At column 15, line 40 (Approx.), please delete "128M 4-bit" and insert -- 128M x 4-bit --, therefor.

At column 15, line 41 (Approx.), please delete "128M 8-bit" and insert -- 128M x 8-bit --, therefor.

At column 15, line 55, please delete "128M 8-bit" and insert -- 128M x 8-bit --, therefor.

At column 15, line 57, please delete "128M 4-bit" and insert -- 128M x 4-bit --, therefor.

At column 15, line 61, please delete "128M 8" and insert -- 128M x 8 --, therefor.

At column 15, line 62, please delete "128M 4" and insert -- 128M x 4 --, therefor.

At column 17, line 25 (Approx.), please delete "128M 8-byte" and insert -- 128M x 8-byte --, therefor.

At column 17, line 26 (Approx.), please delete "128M 8-bit" and insert -- 128M x 8-bit --, therefor.

At column 17, lines 27-28 (Approx.), please delete "128M 8-byte" and insert -- 128M x 8-byte --, therefor.

UNITED STATES PATENT AND TRADEMARK OFFICE
CERTIFICATE OF CORRECTION

PATENT NO.       : 7,286,436 B2
APPLICATION NO.  : 11/075395
DATED            : October 23, 2007
INVENTOR(S)      : Bhakta et al.

It is certified that error appears in the above-identified patent and that said Letters Patent is hereby corrected as shown below:

At column 17, line 28 (Approx.), please delete "128M 8-bit" and insert -- 128M x 8-bit --, therefor.

At column 17, line 34 (Approx.), please delete "128M 8-byte" and insert -- 128M x 8-byte --, therefor.

Signed and Sealed this

Sixteenth Day of December, 2008

JON W. DUDAS
*Director of the United States Patent and Trademark Office*